(12) United States Patent
Schimmel

(10) Patent No.: US 8,936,200 B2
(45) Date of Patent: Jan. 20, 2015

(54) METHOD FOR INJECTION MOULDING AN EXTERNAL HOUSING OF AN OBJECT, OBJECT AND APPARATUS FOR INJECTION MOULDING

(75) Inventor: Johannes Adelbert Schimmel, Santa Cruz, CA (US)

(73) Assignee: Balluff GmbH, Neuhausen (DE)

( * ) Notice: Subject to any disclaimer, the term of this patent is extended or adjusted under 35 U.S.C. 154(b) by 355 days.

(21) Appl. No.: 13/509,358

(22) PCT Filed: Nov. 11, 2009

(86) PCT No.: PCT/EP2009/064970
§ 371 (c)(1),
(2), (4) Date: Jun. 18, 2012

(87) PCT Pub. No.: WO2011/057662
PCT Pub. Date: May 19, 2011

(65) Prior Publication Data
US 2012/0248199 A1    Oct. 4, 2012

(51) Int. Cl.
*G06K 19/06* (2006.01)
(52) U.S. Cl.
USPC ................ 235/492; 235/487; 235/380
(58) Field of Classification Search
USPC ............... 235/380, 375, 492, 487, 488
See application file for complete search history.

(56) References Cited

U.S. PATENT DOCUMENTS

| 4,584,767 A * | 4/1986 | Gregory .................... 29/848 |
| 5,973,599 A | 10/1999 | Nicholson et al. |
| 2002/0017732 A1 | 2/2002 | Koyama |

FOREIGN PATENT DOCUMENTS

| EP | 545487 A2 | 6/1993 |
| EP | 1052594 A1 | 11/2000 |

OTHER PUBLICATIONS

International Search Report dated Jun. 23, 2010 issued in corresponding International Application No. PCT/EP2009/064970, 2 pages.

* cited by examiner

*Primary Examiner* — Karl D Frech
(74) *Attorney, Agent, or Firm* — Duane Morris LLP

(57) ABSTRACT

A method for injection molding an external housing of an object including an electronic assembly includes interposing the assembly between a first half-mold and a second half-mold of an open injection mold and closing the first half-mold and the second half-mold to define an injection cavity containing the assembly. Plastic is injected in the cavity to mold said external housing. The step of interposing includes positioning, before the injection of plastics, the assembly on movable support means associated with the mold, the support means being arranged on an extended position, and disengaging the support means from the assembly before the plastic is cured such as to manufacture the external housing in an only one shot manufacturing process. This way, plastic of the external housing is integrally molded and devoid of discontinuity points.

34 Claims, 9 Drawing Sheets

METHOD FOR INJECTION MOULDING AN EXTERNAL HOUSING OF AN OBJECT, OBJECT AND APPARATUS FOR INJECTION MOULDING

BACKGROUND AND SUMMARY OF THE INVENTION

The present invention relates to a method for injection moulding an external housing of an object, said object comprising an electronic assembly.

In particular, said method relates to an injection moulding method for a high temperature or harsh environment RFID tag or wireless device. Furthermore, the present invention relates to a molding apparatus and to an object obtained by said injection moulding method.

RFID tags and RFID systems are widely used and are well-known in the arts for several identifying, monitoring and controlling applications. Such RFID tags usually comprise an electronic assembly defined by a substrate carrying an IC circuit and an antenna. Said antenna transmits/receives from said IC circuit to an external device, host or computer system which interfaces to the RFID tag via an RF link.

Besides RFID tag, wireless electronic devices such as wireless sensors have been developed recently. A wireless sensor network of spatially distributed and cooperating autonomous wireless sensors is able to monitor physical or environmental conditions in many industrial and civilian application areas, including industrial process monitoring and environment control. Each wireless sensor includes electronics on a substrate, that is an electronic assembly, and an antenna for wireless communication and thus the structure of said sensors can be assimilated to the structure of RFID tags.

The electronic assembly is usually received inside an external housing so that the RFID tag or the wireless device is protected from being unnecessarily broken or damaged. Moreover said external housing allows the RFID tag or the wireless device to be encapsulated for durability against shock, fluid or dust and to be attached to a product.

As far as RFID tags are concerned, RFID tags are packaged on a variety of different forms to comply with different needs. The material with which said external housing is built, usually stiff plastics for harsh environment application, allows said tag to be adhered to a product by glue or instead to be fastened by a multitude of fastening elements. In case the RFID tag is packaged such as to be fastened to a product, a through hole is provided on said RFID to receive a shank of a fastening element, for example a shank of a screw. Said through hole of said RFID tag is obtained with a mounting through hole in said external housing and with a correspondent bigger further mounting through hole in said electronic assembly, which are aligned in a manufacturing step of said RFID tag. It is thus possible to obtain an RFID tag in which said external housing encapsulates said further through hole and provides a region around said through hole in which said electronic assembly is not present, such that only said external housing is stressed when said tag is fastened to a product.

For both RFID tags or wireless electronic devices, it is known manufacturing their external housing by mounting a top of plastics over a base of the same material, thus forming a chamber therein. Said electronic assembly is placed during manufacturing over said base and enclosed inside said chamber when said top is sealed on said base in a two stage process. Usually, said top is over moulded to said base or adhesive sealed, defining a welding border.

In case a through hole is needed in the object, said through hole in the top, in the bottom and in said assembly is machined in a first process stage and then subsequently said top, bottom, and assembly are combined in said two stage process. Therefore, said through hole defines a further welding border in said objects.

The external housing of said objects is critical in certain applications. For example, although protecting from most environmental factors, high temperature and/or harsh chemical environments may adversely affect plastics with which said external housing is built. Moreover, welding borders represent discontinuity points for said external housing and are often subjected to cracks, from which liquids, water or chemicals, may penetrate into the inside of the object. Furthermore, in case of objects with a through hole fastened in operation to a product by a screw, said further welding border is even more stressed, due to the pressing of said screw on plastics around said through hole, such that the discontinuity represented by said further welding border is critical.

From U.S. Pat. No. 5,973,599, is known an improved high temperature tag RFID, in which an electronic assembly is placed inside an external housing comprising a thermally resistant plastics, namely plastics with glass fibres, also called glass filled plastics. The housing top is not sealed over the base since it is sealably injection moulded to the housing base, encapsulating the assembly therein. The RFID tag of U.S. Pat. No. 5,973,599 also comprises a central through hole that allows the tag to be either fastened or glued on the product.

The addition of glass to plastics yields a very strong, yet lightweight material, that improves characteristics of plastics, such as resistance to high temperature and chemicals, but makes plastics more difficult to be machined. Due to the fact that glass fibres in plastics have a melting point much higher than the melting point of plastics, closer to the melting point of glass, the higher is the percentage of glass in plastics, the higher is the difficulty, at the usual injection moulding temperature of plastics, of a layer of glass filled plastics to over mould another layer of glass filled plastics in a two stage injection moulding process. As a result of the over moulding, portions of the mating surfaces between the two over moulded layers do not melt together, causing discontinuity points in the plastics of the external housing of the object which evolve during operation, giving rise to micro cracks inside said plastics that lead to leak paths from which liquids, water or chemicals, may penetrate into the inside of the object.

An object of the invention is to solve the aforementioned drawbacks, providing an object comprising an electronic assembly enclosed in an external housing made of plastics, in which said external housing is improved.

In particular, a further object of the invention is to provide an object comprising a through hole in which plastics of said external housing around said through hole are further improved.

A further object is to obtain an improved injection moulding method that eliminates defects in the over moulding or adhesive sealing of the external housing of said object, such that said external housing provides an improved resistance to high temperature and chemicals.

A further object is to provide an injection moulding apparatus allowing said method to be achieved.

In a first aspect of the invention, a method of injection moulding a plastics external housing of an object according to claim 1 is provided.

In a second aspect of the invention, an object according to claim 22 is provided.

In a third aspect of the invention, an apparatus according to claim 27 is provided.

Owing to these aspects of the invention it is possible to manufacture an object comprising an electronic assembly encapsulated inside an external housing made of plastics in which said external housing is a single continuous body of plastics. In other words, said plastics are integrally moulded and devoid of discontinuity points without neither welding borders nor mating surfaces.

In particular, by interposing said assembly between a first half-mould and a second half-mould defining a moulding cavity, and injecting plastics having positioned movable support means holding said assembly inside said injection cavity, it is possible to inject plastics all around said assembly at the same time. Furthermore, said support means is disengaged from said assembly before said plastics are cured, thus manufacturing said external housing is obtained with only one shot process step that encapsulates said assembly on an external body of plastics in which plastics are a single continuous body. In other words, said plastics are integrally moulded and devoid of discontinuity points without neither welding borders nor mating surfaces. In this manner, objects like RFID tags or wireless electronic devices presenting the injected external housing of the invention have enhanced properties during operation in high temperature and/or harsh chemical environments.

Furthermore, according to an embodiment of the invention, in case a through hole is needed in said objects and thus said assembly is provided with a further through hole, the injection nozzle is positioned in a protrusion of a half-mould facing a further protrusion of the other half-mould defining an injection chamber therebetween. Positioning said protrusions inside said further through hole, plastics from said chamber flow into said cavity and encapsulate portions of said assembly around said further through hole, manufacturing at the same time said through hole. As a result, an external housing is obtained as a single continuous body provided with a through hole in only one single shot process step. Consequently, said plastics are integrally moulded and devoid of discontinuity points at said through hole without being necessary a previous or subsequent manufacturing process step to obtain said through hole.

BRIEF DESCRIPTION OF THE DRAWINGS

The invention can be better understood and implemented with reference to the attached drawings, which illustrate some embodiments thereof by way of non-limiting example, in which.

DETAILED DESCRIPTION

Figure 1:
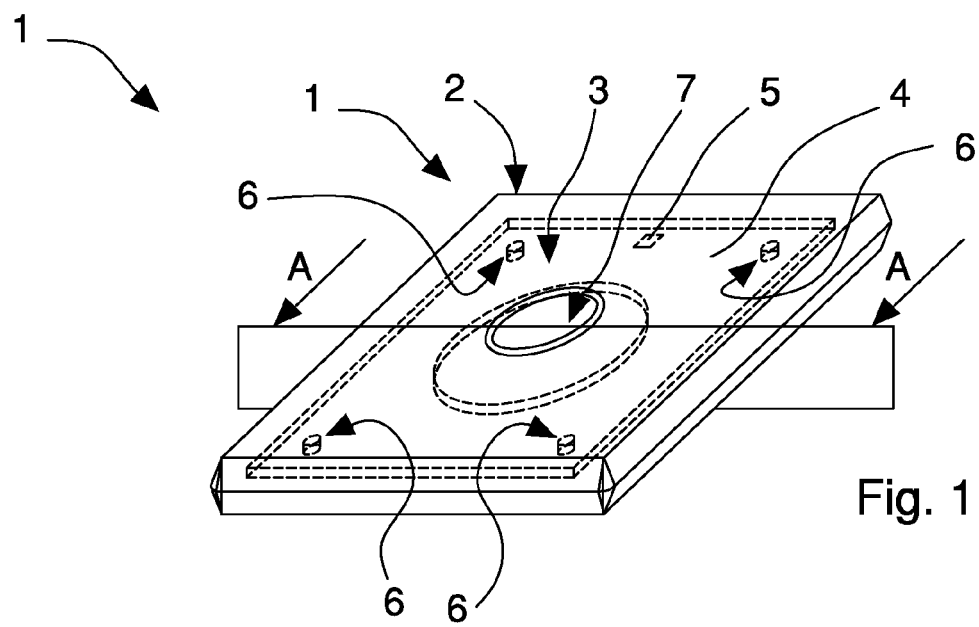
FIG. 1 is a simplified perspective view of an object, for example a typical RFID tag, comprising an electronic assembly housed in an external housing.
Figure 2:
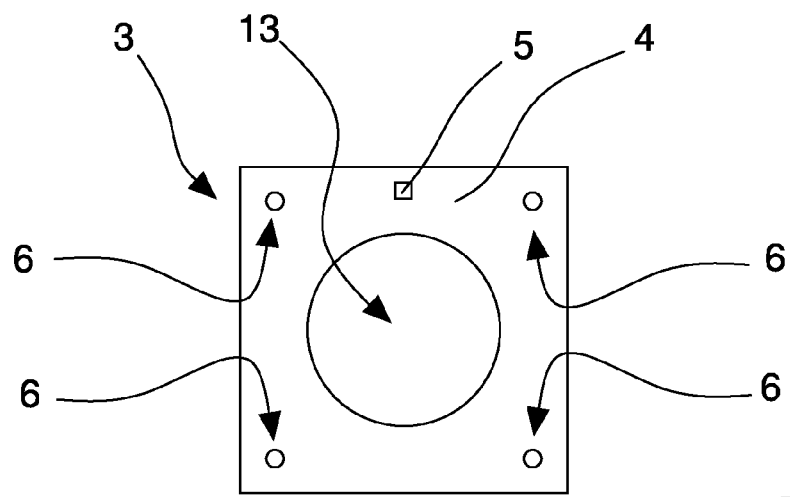
FIG. 2 is a simplified plan view of the electronic assembly in FIG. 1.
Figure 3:
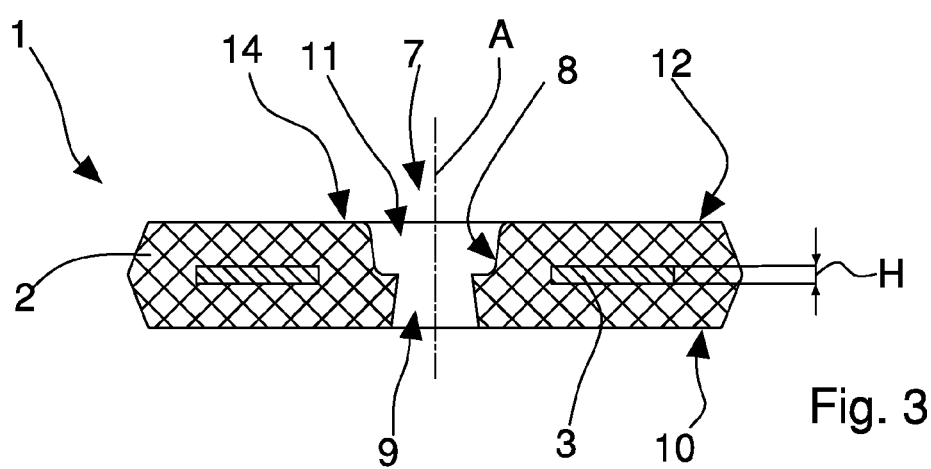
FIG. 3 is a section taken along the plane A-A of the object in FIG. 1.

With reference to FIG. 1, FIG. 2 and FIG. 3, there is shown an object 1, in particular an RFID tag, comprising an electronic assembly 3, encapsulated in an external housing 2 made of plastics.

The expression "plastics" is used in the present description and in the claims to indicate any synthetic or semisynthetic amorphous material suitable for the manufacture of industrial products and that is suitable to be injection moulded. In particular, said plastics have a survival temperature in the range approximately of 220° C. to 300° C. being a thermally resistant plastics comprising Teflon® or a Noryl® based compound or a Ryton® PPS based compound.

Said electronic assembly 3 comprises a substrate 4 (for example a PCB printed circuit board substrate) having an integrated circuit 5 (IC chip) thereon and one antenna (not illustrated). It should be noted that said RFID tag 1 does not contain a battery, namely is "passive" because the power is supplied by the reader of the tag 1. When radio waves from the reader are encountered by said passive RFID tag 1, the antenna of said tag 1 enters into a magnetic field from which said tag 1 draws power, energizing said IC chip 5. Alternatively, said tag 1 may be equipped with a battery, used as a partial or complete source of power.

The expression "object" is used in the present description and in the claims to indicate any device that is suitable for wireless communication, such as active RFID tag, passive RFID tag or wireless sensor.

With reference to FIG. 1, said object 1 has a substantially square shape, although the shape of the object is not relevant for the present invention. The electronic assembly 3 comprises four through holes 6, positioned aligned along its external sides and symmetrical in pair, although the position and the number of through holes is not relevant for the present invention, as it will be explained more in detail below. Each of through holes 6 is for example at a corner of the assembly 3 and is filled with plastics, as a result of the injection of the external housing 2.

Said object 1 furthermore comprises a mounting through hole 7 in the external housing 2, illustrated in FIGS. 1 and 3, intended for housing mounting fixing means, like screws, during installation of the object in operation. The mounting through hole 7 extends along a longitudinal axis A which is also a symmetry axis for said mounting through hole 7. In fact, said mounting through hole 7 shows a cross-section which has a variable width along said longitudinal axis A such that a symmetrical surface 8 bounds externally the mounting through hole 7, shaped along said axis A to accommodate both a shank and a head of a fastening means.

In particular, a first portion 9 of said mounting through hole 7 at a flat bottom face 10 of the object 1, that is a side which in use is in contact to the product to be connected to, is provided with a smaller cross-section with respect to a second portion 11 of the mounting through hole 7, at a top flat face 12 of said object 1. The second portion 11 is shaped such as to receive the head of fastening means, as for examples a tapered or a hexagonal head of a screw.

A further mounting through hole 13 is provided in said electronic assembly 3 and is encapsulated by a region of plastics 14 between said mounting through hole 7 and said assembly 3, manufactured during the injection process, as below explained. Said further mounting through hole 13 is shaped like a thin cylinder of a given height H, having said axis A as symmetry axis.

Within this region 14, plastics are stressed when said fastening means are received in said mounting through hole 7. However this stress is not transmitted to said assembly 3, since said fastening means are only applied on said plastics.

With reference to FIG. 1 and to FIG. 3, it should be noted that the final shape of said object 1, a polyhedron having said flat top face 12 and flat bottom face 10 and lateral side faces, is obtained with an injection moulding apparatus of the invention.

FIGS. 4 to 11 show a moulding apparatus for obtaining objects of the type shown in FIGS. 1 to 3 through injection moulding, comprising a mould 21.

Figure 4:
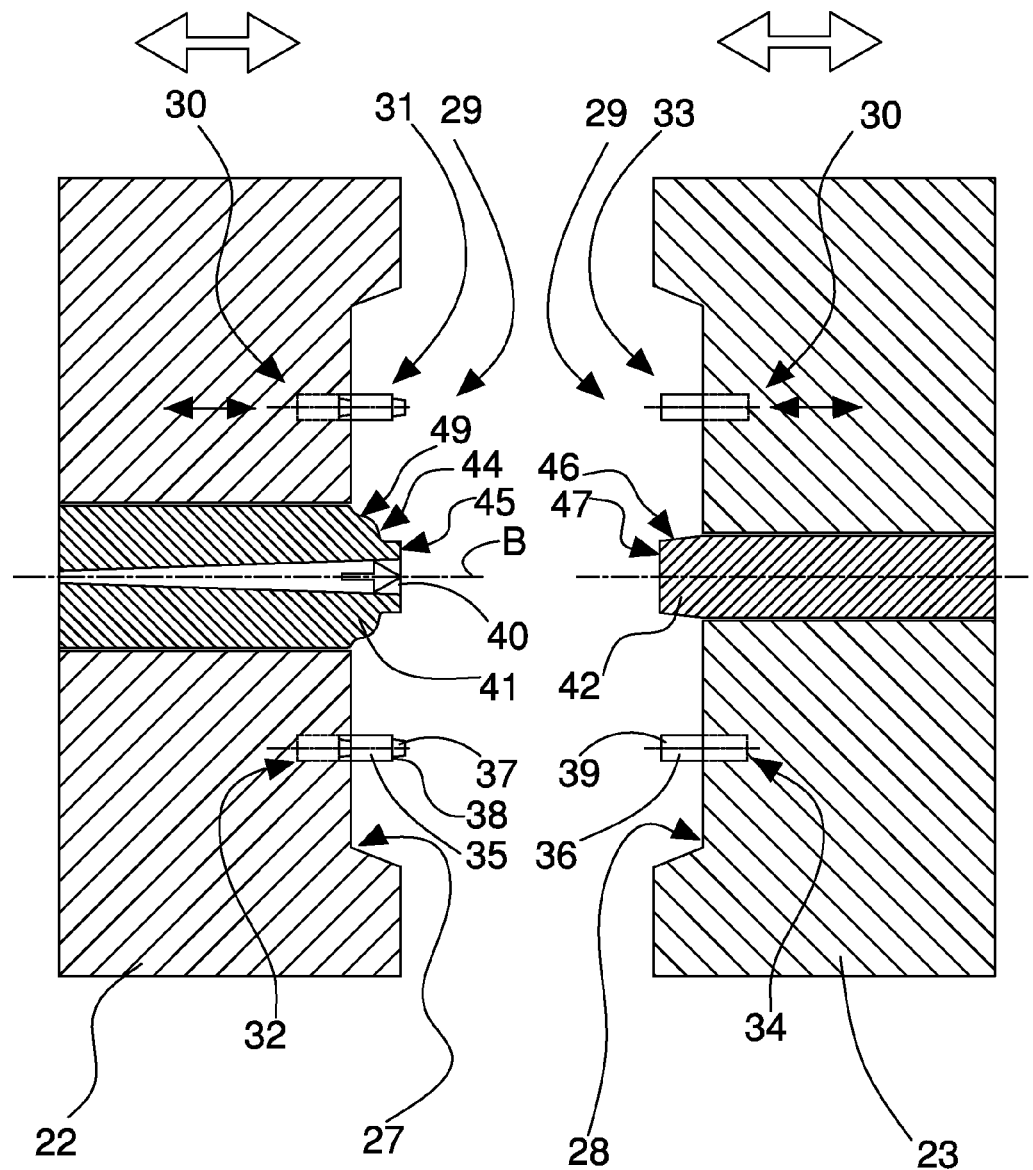
FIG. 4 is a schematic transversal cross-section of an injection mould in an open configuration, with support means in an extended configuration, before said assembly is interposed in the mould.

The mould 21 comprises a first half-mould 22 and a second half-mould 23, movable along a moulding axis and able to interact mutually to shape said faces of the object 1. As shown in FIG. 4, the first half-mould 22 and the second half-mould 23 are movable by driving means, which is not shown, between a closed position, shown in FIG. 5, and an opened position shown in FIG. 4. In the closed position, said mould 21 defines a cavity 24 provided with walls 25 intended for providing a forming surface 26 enabling the object 1 to be externally shaped. In particular, walls 25 comprise first walls 27 of the first half-mould 22 and second walls 28 of the second half-mould 23 that cooperate to define the forming surface 26.

Figure 10:
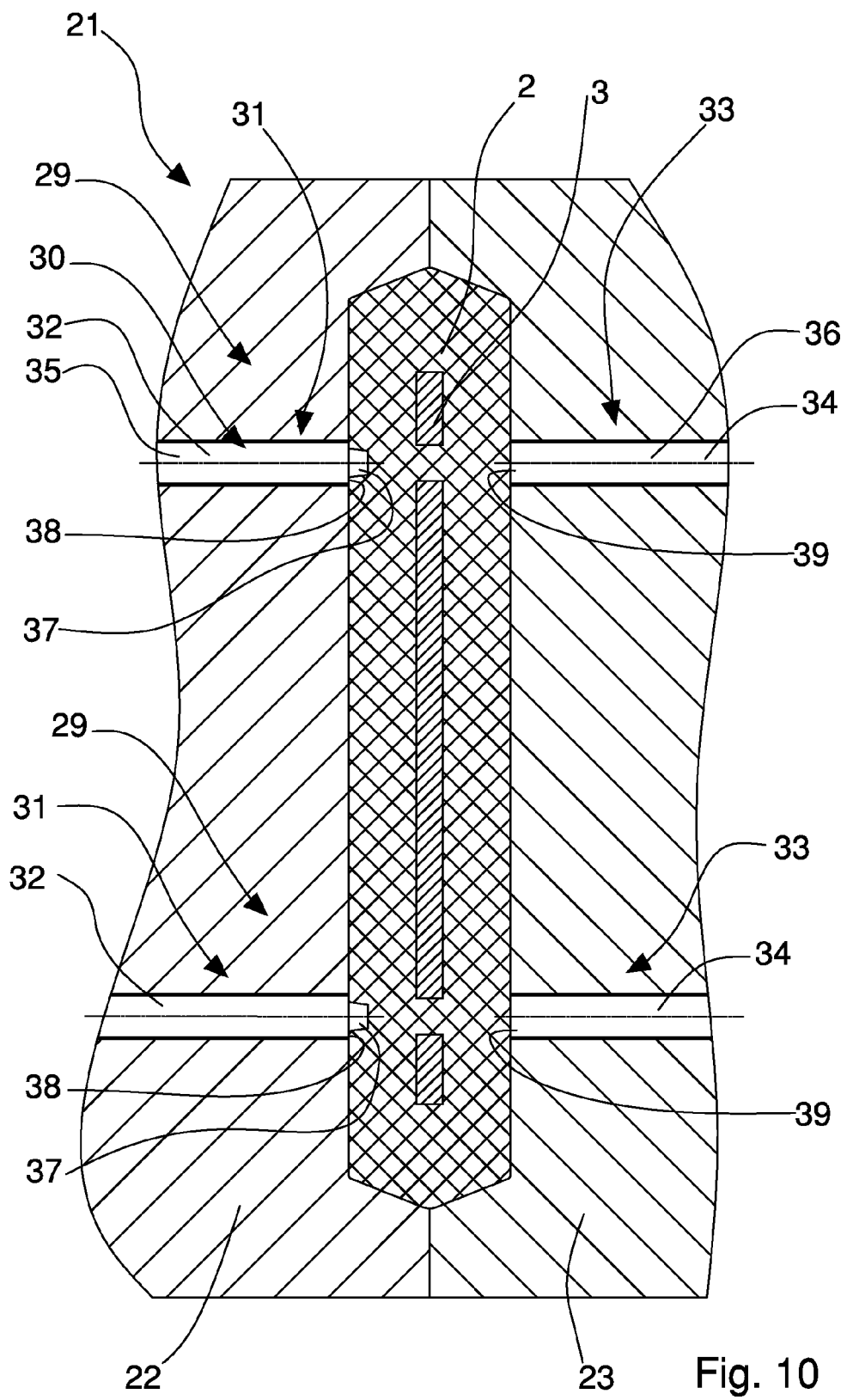
FIG. 10 is a schematic further transversal cross-section of the injection mould in FIG. 9 taken at the through hole of the assembly, showing the first support means in a first embodiment of said first retracted position.

Said apparatus further comprises support means 29 movable between a retracted position, shown in FIG. 10, in which the support means 29 is arranged in seat means 30 of the mould 21 and an extended position, shown in FIG. 4, in which the support means 29 is arranged inside the cavity 24, out of the seat means 30. The support means 29 in said extended position is suitable for receiving the assembly 3 and for maintaining the assembly 3 in position during injection. It should be noted that the support means 29 in the extended position enables the assembly 3 to be held at an injection position, notwithstanding a flow of plastics in the cavity 24 during injection. When the support means 29 is in said retracted position, the support means 29 is suitable for being disengaged from the assembly 3 such as to guarantee plastics to encapsulate the assembly 3 in the external housing 2.

The support means 29 comprises first support means 31, associated with the first half-mould 22, movable by first driving means (not shown) between a first retracted position and a first extended position. In the first retracted position, the first support means 31 is housed substantially entirely or partially, as it will be explained below, in the first seat means 32 of the first half-mould 22, whereas in the extended position the first support means 31 is positioned out of the first seat means 32, inside the cavity 24. In other words, the first support means 31 in the extended position protrudes from the first walls 27 of the first half-mould 22 and occupies space inside the cavity 24, which is cleared when the first support means 31 is in the retracted position.

Similarly, the support means 29 comprises second support means 33, associated with said second half-mould 23, movable by second driving means (not shown) between a second retracted position and a second extended position. In the second retracted position, the second support means 33 is housed substantially entirely or partially, as it will be explained below, in second seat means 34 of the second half-mould 23, whereas in the second extended position the second support means 33 is positioned out of the second seat means 34, inside the cavity 24. In other words, said second support means 33 in the extended position protrudes from second walls 28 of said cavity 24 and occupies space inside the cavity 24, which is cleared when the second support means 33 is in the retracted position.

Figure 5:
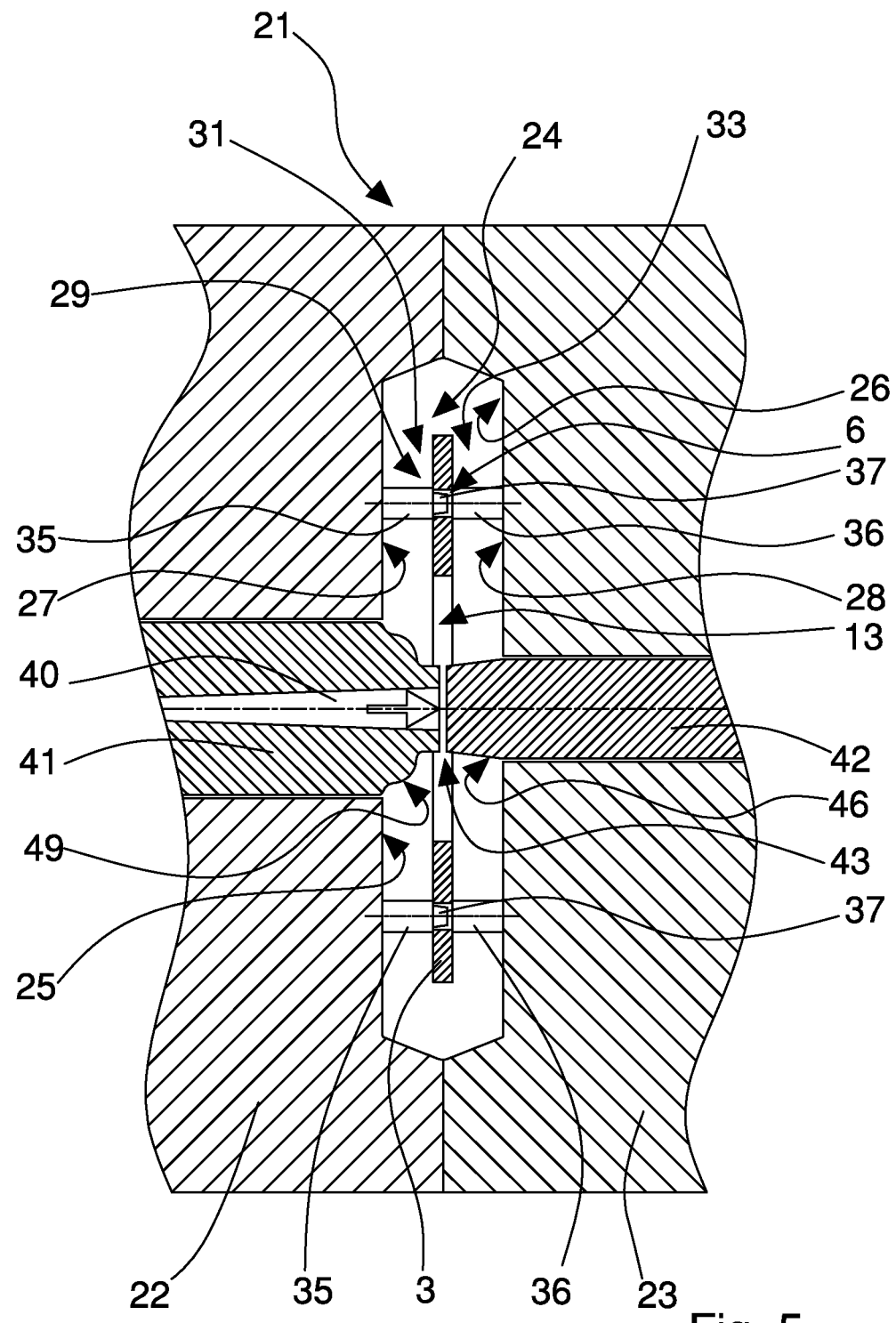
FIG. 5 is a schematic transversal cross-section of a closed injection mould in which said assembly is in an injection configuration within a mould cavity, with support means in said extended configuration, along a section substantially at an injection nozzle of said mould.

As shown in FIG. 5, the first support means 31 in the first extended position and the second support means 33 in the second extended position are suitable for clamping, during injection of plastics, the electronic assembly 3, maintaining the assembly 3 in the injection configuration, in which the assembly 3 is distanced from both first walls 27 and second walls 28.

Said first support means 31 comprises a first pin 35 which is aligned and faces a second pin 36 of the second support means 33. The first pin 35 and second pin 36 define a pair of pins, for clamping the assembly 3 therebetween in the injection configuration. It should be noted that the first support means 31 may also comprise a plurality of first pins facing and aligned to a plurality of second pins 36, defining a plurality of pairs of pins. The injection apparatus of the present invention comprises four pairs of pins. However, the number of pairs of pins and their position in the mould 21 may be dependent upon the shape of the object to be manufactured, without departing from the scope of the invention.

The first pin 35 is a cylinder provided with a respective tapered end 37, a portion of which, as it will be explained below, is suitable to be fixed in a correspondent through hole 6 of the assembly 3. Said tapered end 37 has a shape which is substantially a truncated cone whose base diameter is minor than the width or diameter of the pin and its height is minor than the thickness of said assembly 3. The truncated cone is bounded by an annular shoulder 38 substantially transversal to the axis of the first pin 35. The second pin 36 is cylindrical and provided with a flat end 39, instead.

It should be noted that the disc shaped cross-section of first and second pins is not relevant for the purpose of the invention.

It has to be outlined that the first pin 35 and the second pin 36 have a width which is bigger than the width of their corresponding through hole 6. In particular, the width of the base diameter of the truncated cone 37 is bigger than or equal to the width of the through hole 6. It follows that when the tapered end 37 of the first pin 35, presenting a base diameter bigger than the through hole 6, is fit there, an annular portion of said assembly 3 around this through hole 6, consisting usually of deformable plastics, on one side of the assembly 3, get deformed until the assembly 3 abuts the annular shoulder 38. On opposite side, the end 39 of the second pin 36 closes the through hole 6, abutting with the flat end 39 thereof the assembly 3 and clamping the assembly 3 therebetween. This way, an interference fit maintains the assembly 3 in position during injection.

The apparatus further comprises a nozzle 40 presenting a longitudinal axis B, from which plastics are supplied and injected into the cavity 24. The nozzle is accommodated in a protrusion 41 of one half-mould, facing and aligned to a further protrusion 42 on the other half-mould. In particular, the nozzle 40 is shown in Figures as comprised in the first half-mould 22. However, it is not relevant in which half-mould the nozzle 40 is comprised, being allowable either in the first half-mould 22 or in the second half-mould 23.

In the closed position of said mould 21, the protrusion 41 and the further protrusion 42 define an injection sprue volume or gate 43 therebetween.

In particular, the protrusion 41 projects from the first half-mould 22 with lateral walls 44 forming part of first walls 27 towards the inside of the cavity 24. The protrusion 41 ends on an extremity wall 45, comprising an opening from which plastics from said nozzle 40 are injected into the cavity 24. Similarly, the further protrusion 42 projects from the second half-mould 23 with further lateral walls 46 forming part of second walls 28 towards the inside of the cavity 24. The further protrusion 42 ends on a further extremity wall 47, facing and aligned to the extremity wall 45, such that the injection sprue volume 43 is delimited on opposite sides by said extremity wall 44 and by said further extremity wall 46, parallel each other.

Said injection sprue volume 43 is furthermore provided by an open lateral border 48 from which plastics from the injection sprue volume 43 flow into the cavity 24. The extremity wall 45 and the further extremity wall 47 are disc shaped (or special formed to assist in better flow of plastics during the injection phase) and have substantially the same dimension. Therefore the injection sprue volume 43 is substantially a thin cylinder of a given height h, having a longitudinal axis C as symmetry axis, whose lateral sides correspond to the lateral border 48.

Even in case the extremity wall 45 and the further extremity wall 47 are not disc shaped and/or have dimension different from one another but are parallel each other, it is always possible to determine a symmetry axis C for said injection volume 43, parallel to said longitudinal axis A of said further mounting through hole 13.

In said injection configuration, the symmetry axis C of said injection sprue volume 43 is on the longitudinal axis B of said nozzle 40, which is on the longitudinal axis A of the further mounting through hole 13. In particular, the injection sprue volume 43, the nozzle 40 and the further mounting through hole 13 have the same symmetry axis.

Furthermore, the injection sprue volume 43 is inside the further mounting through hole 13 of the assembly 3 such that a midpoint of the height H of the further mounting through hole 13, along the symmetry axis A of said further mounting through hole 13, corresponds to substantially a midpoint of the height h of the injection sprue volume 43 along the symmetry axis C of said injection sprue volume 43. In other words, the injection sprue volume 43 is centred in the middle of the further mounting through hole 13 to guarantee symmetrical filling of the cavity 24 either towards the first half-mould 22 and towards the second half-mould 23 at the same time during injection.

Lateral walls 44 and further lateral walls 46 thus are intended for internally shaping the surface 8 of the mounting through hole 7 during injection. Therefore, the shape of said protrusion 41 and/or of said further protrusion 42 result in the shape of the mounting through hole 7.

For example, the protrusion 41 shows a curved wall 49, having a curved cross section of variable width positioned towards first walls of the first half-mould 22. The curved wall 49 shapes during injection a portion of the forming surface 26, which is a curved surface corresponding to the second portion 11 of the mounting through hole 7, which is suitable in operation to receive said head of said fastening means, as for examples a tapered or a hexagonal head of a screw.

During operation, the moulding apparatus is initially in an open position shown in FIG. 4, in which the first half-mould 22 is distanced from the second half-mould 23 and the support means 29 is in its extended position. In particular both the first support means 31 and the second support means 33 are in their respective extended position so that first pins 35 and second pins 36 protrude from respective first walls 27 and second walls 28, at the beginning of the injection cycle.

Before closing the mould 21, an electronic assembly 3 is interposed between the first half-mould 22 and the second half-mould 23, positioned on the movable support means 29 in said extended position. Positioning the assembly 3 in a steady manner on the support means 29 is very important for the subsequent injection cycle. For this reason, the tapered ends 37 of first pins 35, whose base diameter is bigger than the diameter of the through hole 6, easily enters initially in said through hole 6, subsequently deforming an annular portion of the assembly 3 to fix it in first pins 35. Regardless of the fact that the assembly 3, when pushed against the annular shoulder 38, abuts or not against the annular seat of first pins 35, a stable positioning of the assembly 3 into first pins 35 is always assured.

In case the mould 21, as represented in Figures, is vertically oriented, having an interference fit allows the assembly 3 to be positioned vertically in a very easy manner. Nevertheless, it should be noted that the orientation of the mould 21 is not important for the purpose of the invention, being either possible a horizontal or vertical positioning. Furthermore, it is also possible to position the assembly 3 in first pins 35 even without the interference fit when the assembly 3 abuts against the annular shoulder 38, because the base diameter of the tapered end 37 is equal to the diameter of the through hole 6.

Figure 6:
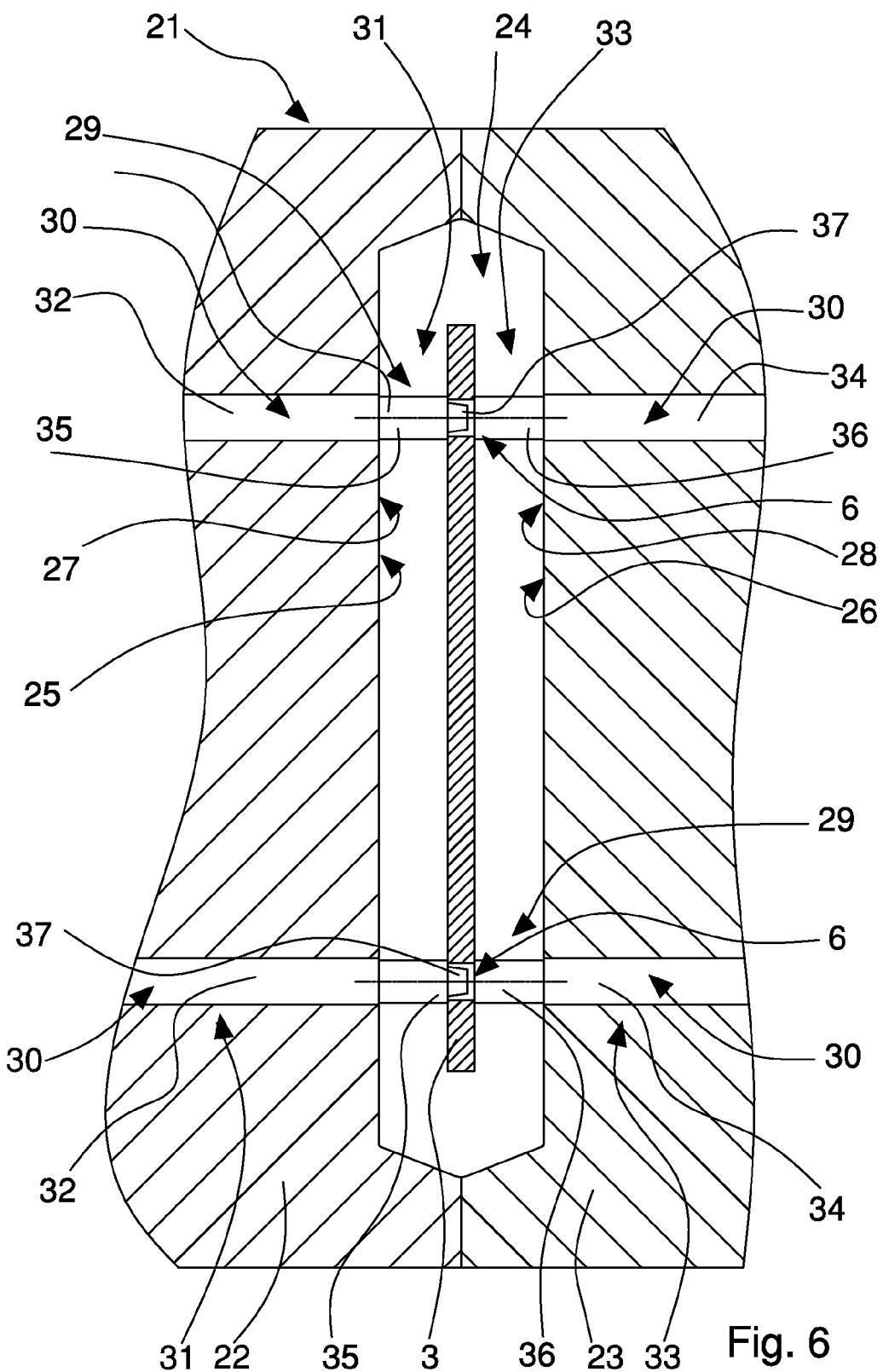
FIG. 6 is a further schematic transversal cross-section of the injection mould of FIG. 5, taken substantially at a through hole of said assembly.

When the mould 21 is closed and before injecting said plastics, the assembly 3 is clamped in an injection configuration between the first support means 31 and the second support means 33, as shown in FIG. 5 and in FIG. 6. In particular, the assembly 3 is clamped between first pins 35 and second pins 36 which close said through hole 6 at both sides of the assembly 3. In this manner, the assembly 3 is maintained distanced from first walls 27 and second walls 28 in the injection configuration.

Figure 7:
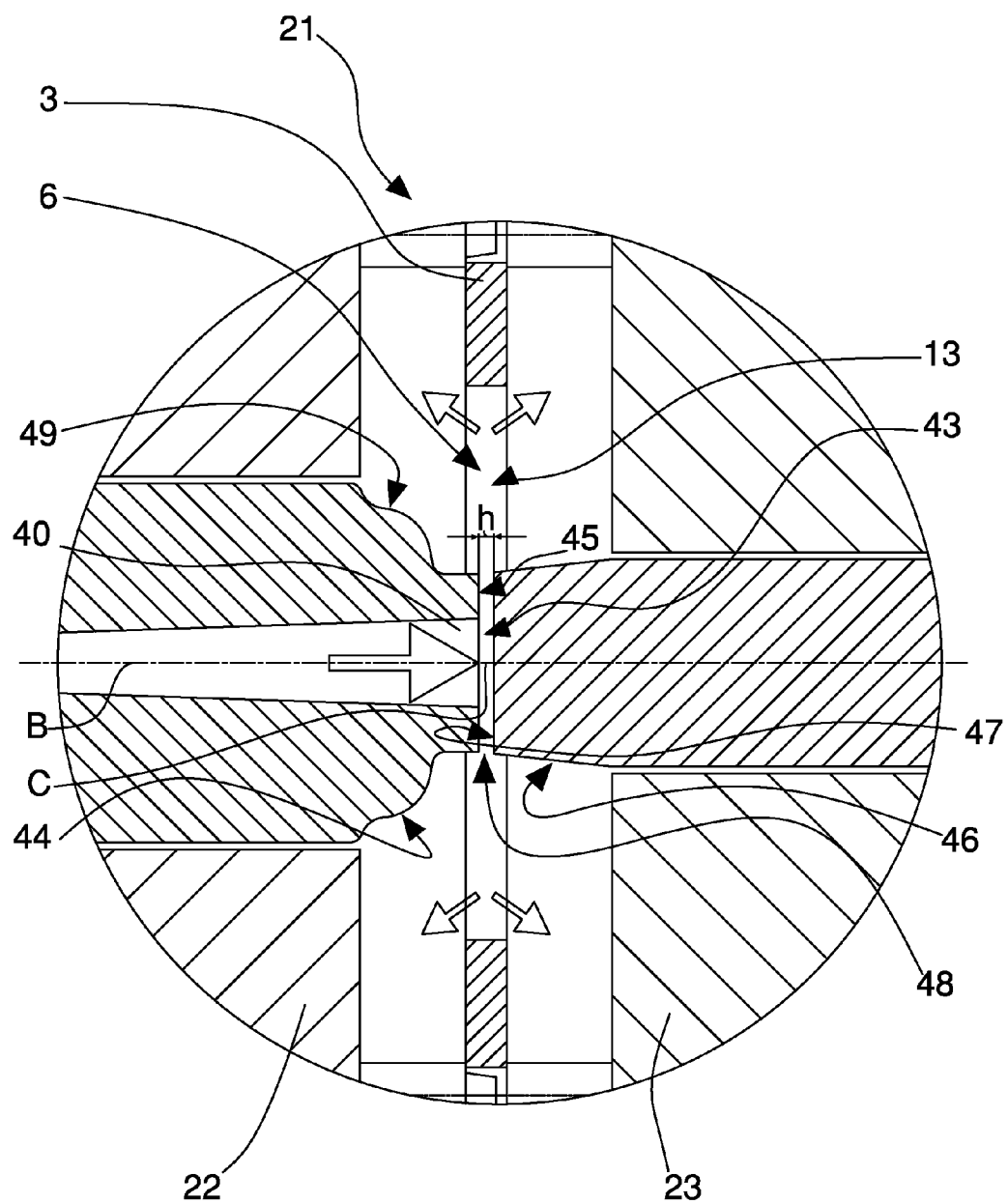
FIG. 7 is an enlarged detail of the injection mould of FIG. 5, with arrows showing plastics flowing towards first half-mould and second half-mould at the beginning of the injection.

FIG. 7 shows the apparatus at the beginning of the injection, when said plastics begin to flow into the cavity 24. It should be noted that the injection sprue volume 43 is provided inside the further mounting hole 13, in a position which is substantially central with respect to it. This is achieved by positioning the midpoint of the height h of the injection sprue volume 43 along the longitudinal axis A at the midpoint of the height H of the further mounting through hole 13 along the same longitudinal axis A such that the injection sprue volume 43 is substantially at the symmetry axis of the further mounting through hole 13.

In other words, the injection sprue volume 43 is centred with respect to both the height and the width (e.g. the diameter) of the further mounting through hole 13.

This way, plastics are injected from the open lateral border 48 of the injection sprue volume 43 towards the first half-mould 22 and the second half-mould 23 at the same time, so that the further mounting through hole 13 is encapsulated with plastics thus creating the mounting through hole 7 during injection.

Due to the position of the injection sprue volume 43, plastics fill both a volume of the cavity 24 between the first half-mould 22 and the assembly 3 and a volume of the cavity 24 between said second half-mould 23 and the assembly 3 with respective amounts of plastics with are approximately the same in the same time. This makes the effect that both back flow and front flow of plastics move at the same time and that the pressure of the plastics is substantially the same on both sides of the assembly 3.

Figure 8:
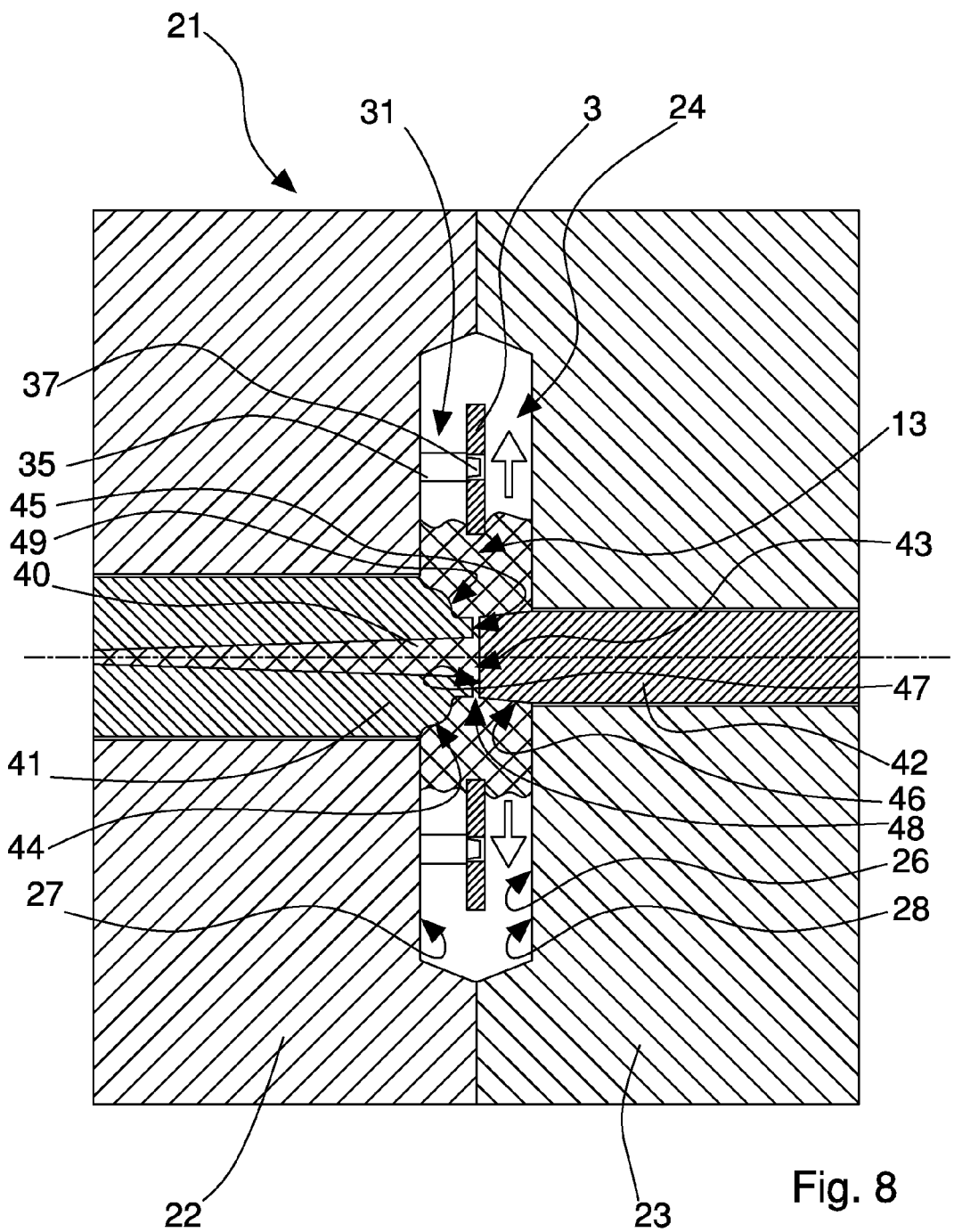
FIG. 8 is a schematic transversal cross-section of the injection mould, in which second support means is disengaged from said assembly while first support means is maintained in the through hole, plastics injected in said cavity enabling said injection configuration to be maintained.

FIG. 8 shows the cavity 24 filled with plastics on both sides of the assembly 3, when the mounting through hole 7 has been formed since the further mounting through hole 13 had been already encapsulated with plastics.

When plastics in the cavity 24 reach a zone interposed between the second half-mould 23 and the assembly 3, said plastics, in addition to the second support means 33, support the assembly 3 in the injection configuration.

Then, the second support means 33 is disengaged firstly from the assembly 3 while the first support means 31 is maintained in the through hole 6. In particular, second pins are moved in the second retracted position inside the second seat means 34 clearing the cavity 24 and thus the flat end 39 of second pins 36 forms part of second walls 28. It has to be outlined that plastics have different behaviour in relation to its composition. It has been proven that glass filled plastics begin to support said assembly 3 in the injection configuration when the cavity 24 is 90% filled of plastics, preferably when the cavity 24 is 94% filled of plastics. It means that the zone is reached when the cavity 24 is at least 90% filled.

This above values of 90% or 94% are obtained through experimental tests, said plastics being glass filled plastics. The procedure of the experimental test envisages injection moulding several objects, each object being manufactured disengaging the second supporting means 33 at different values of the percentage of filling.

By examining the inside of the injected object 1 to verify whether the assembly 3 is encapsulated inside the external housing 2 in the injection position or not, it is possible to determine the minimum percentage of filling at which the second support means 33 may be disengaged firstly, to guarantee the target quality for the encapsulated object 1.

After the second support means 33 has been disengaged, the first support means 31 is disengaged lastly from the through hole 6, when plastics injected in the cavity 24 both fill the cavity of an amount such as the injection configuration is guaranteed and at the same are still in a state that guarantees that the through hole 6 is perfectly filled. In particular, first pins 35 are moved to a retracted position inside the first seat means 32 clearing the cavity 24, before plastics are cured. Said disengaging lastly is achieved when the cavity 24 is 95% filled of plastics, preferably when the cavity 24 is 99% filled of plastics.

As mentioned above, said values of 95% or 99% are obtained through experimental tests, using the same procedure disclosed above. Furthermore, it is important that first pins 35 are retracted with plastics still in a pasty state, not cured such that the volume occupied by first pins 35 and the through holes 6 get still filled with plastics integrally moulded and devoid of discontinuity points.

Figure 9:
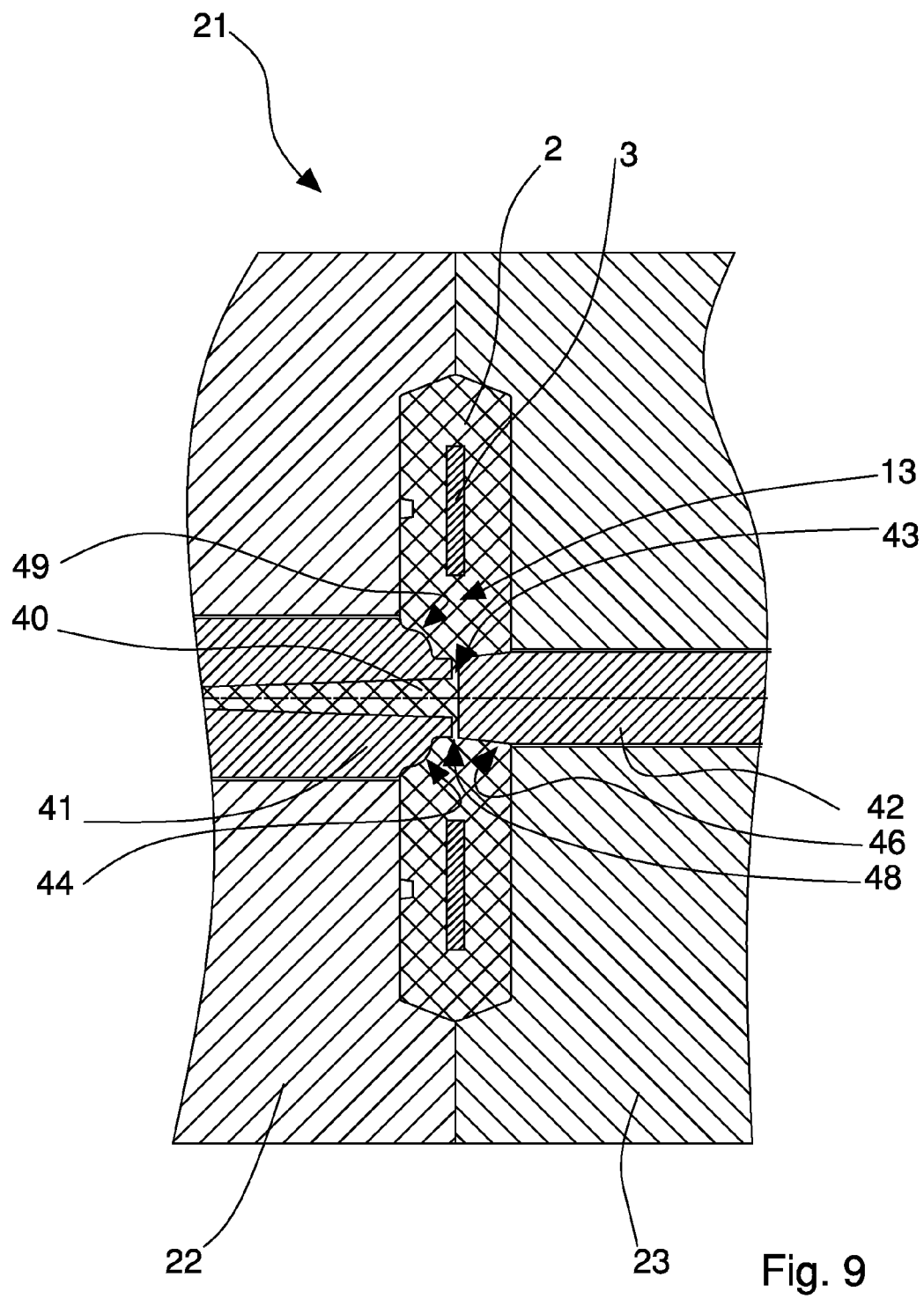
FIG. 9 is a schematic transversal cross-section of the injection mould, in which said assembly is enclosed in said external housing, at the end of the one shot injection process.

It should be noted that first pins 35, provided with said tapered end 37 may be retracted inside the first seat means 32 until the annular shoulder 38 at the base of the tapered end 37 forms part of first walls 31, as shown in FIGS. 9 and 10. This way, said tapered end 37 projects inside the cavity 24 and leaves a small opening in the external housing 2 after said plastics are cured.

Figure 11:
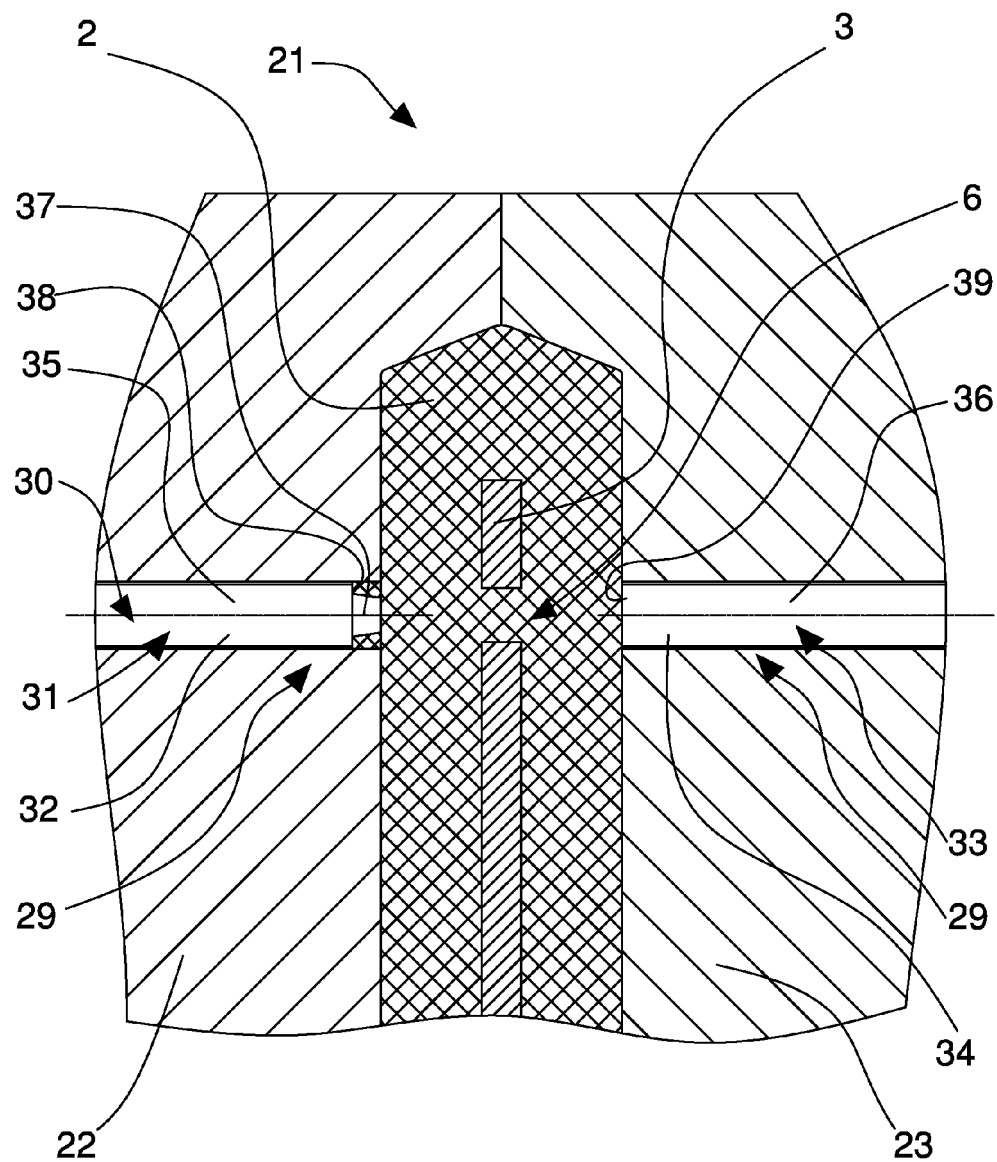
FIG. 11 an enlarged detail of the injection mould in FIG. 10, showing the first support means in a second embodiment of said first retracted position.

By contrast, as shown in FIG. 11, first pins 35 may be completely housed inside the first seat means 32 leaving small protrusions in the external housing 2 after said plastics are cured.

Owing to the apparatus and to the injection moulding method of the invention, many advantages may be achieved.

In fact, having a mould associated to retractable support means 29 allows the external housing 2 to be manufactured encapsulating the assembly 3 in only one shot manufacturing process. The first support means 31 driven independently from the second support means 33 furthermore enables the assembly 3 to be firmly held distanced from the walls of the mould 21 when injection begins and to be encapsulated in succession by said plastics, as soon as said plastics support the assembly 3 in place of the first or second support means.

The protrusion 41 and the further protrusion 42 of the mould 21 position the injection sprue volume 43 centrally inside the further through hole 13 and this provides the mounting through hole 7 in said object 1 to be formed simultaneously with the external housing 2. Furthermore being the injection sprue volume 43 centrally positioned, the flowing of the plastics in the injection sprue volume 43 cooperates with the support means 29 to support the assembly 3 in the injection configuration while plastics encapsulate the assembly 3 thereof. Plastics flowing from nozzle 40 into the cavity 24 uniformly until they are cured, enables the external housing 2 to be integrally moulded since said external housing 2 is injected devoid of discontinuity points even though first support means 31 and second support means 33 are initially positioned inside the cavity 24.

According to a further embodiment, not shown in Figures, the assembly 3 is provided with a number of through holes 6 different from four and positioned differently. The first half-mould 22 and the second half-mould are provided with a number of pairs of first pins 35 and second pins 36 which may be also less than the number of through holes 6 in the assembly 3. Said pairs of pins would then engage only their correspondent through holes 6, each remaining through hole 6 not engaged will be filled with plastics during injection. According to a further embodiment, not shown in Figures, first pins 35 are cylindrical and provided with ends connected to a suction port. The assembly 3 may be thus supported by the first support means 31 even though the assembly 3 does not comprise any of said through hole 6.

According to a further embodiment, also second pins 36 have respective ends connected to a suction port or provided with a tapered end. In other words, both first pins 35 and second pins 36 are suitable to support the assembly 3 during injection. Thus, either first pins 35 or second pins 36 may be disengaged firstly from the assembly 3, irrespectively of the fact that the assembly 3 is positioned on first pins 35 before injection. Subsequently, in case first pins 35 are disengaged firstly from the assembly 3, second pins 36 are disengaged lastly, after first pins 35 have already cleared the cavity 24.

According to a further embodiment, not shown in Figures, the extremity wall 45 and the further extremity wall 47 which bound the injection sprue volume 43 on opposite sides are not parallel to each other and said symmetry axis C of the injection sprue volume 43 is transversal to said longitudinal axis B of said nozzle 40. Even in this case, by positioning a midpoint of the height h of the injection sprue volume 43, along the symmetry axis C of the injection sprue volume, at a midpoint of the height H of said further mounting through hole 13, along the symmetry axis A of said further mounting through hole 13, it is possible to centrally arrange said injection sprue volume 43 inside the further mounting through hole 13 such as the cavity 24 is filled according to the invention.

According to a further embodiment, not shown in Figures, mounting through hole 7 and further mounting through hole 13 are not centred in the object 1 but are side aligned. The mould 21 comprise a protrusion 41 and a further protrusion side aligned. Even in this case, by positioning the injection sprue volume 43 centrally inside the further mounting through hole 13 it is possible to guarantee filling the cavity 24 according to the invention.

What is claimed is:

1. A method for injection moulding an external housing of an object provided with a mounting through hole, in particular a high temperature or harsh environment RFID tag or wireless device, said object comprising an electronic assembly provided with a further mounting through hole; said method comprising the steps of:
   interposing said electronic assembly between a first half-mould and a second half-mould of an open injection mould;
   closing said first half-mould and said second half-mould to define an injection cavity of a mould, containing said assembly; and
   injecting plastics in said cavity wherein said interposing step comprises positioning said assembly on movable support means in an extended position, said support means being associated with said mould, the method further comprising the step of disengaging said support means from said assembly before said plastics are cured such as to manufacture said external housing in only a one shot manufacturing process, plastics of said external housing being integrally moulded and devoid of discontinuity points, wherein the method further comprises:
   providing an injection nozzle on a protrusion of a half-mould facing a further protrusion provided on the other half-mould and defining an injection sprue volume therebetween; and
   positioning said injection sprue volume inside said further mounting through hole for injecting said plastics from said injection sprue volume towards said first half-mould and said second half-mould at the same time, such that said further mounting through hole is encapsulated with plastics, thus creating said mounting through hole during injection.

2. The method according to claim 1, wherein said step of disengaging said support means from said assembly comprises housing said support means in seat means obtained in said mould in a retracted position.

3. The method according to claim 1, wherein said positioning step comprises inserting said support means in at least a through hole of said assembly, before closing said mould.

4. The method according to claim 3, wherein said inserting step comprises fitting said support means in said assembly and deforming a portion of said assembly around said through hole by an interference fit.

5. The method according to claim 1, wherein said support means comprises first movable support means associated with said first half-mould and housed in first seat means of said first half-mould in a first retracted position, said positioning step further comprises inserting said first supporting means in at least a through hole of said assembly, said first support means being arranged on a first extended position in which said first support means are positioned out of said first seat means inside said cavity.

6. The method according to claim 5, wherein said support means comprises second movable support means associated with said second half-mould and housed in second seat means of said second half-mould in a second retracted position, said positioning step further comprises clamping said assembly in a injection configuration between said first support means on said first extended position and said second support means on a second extended position, in which said second support means are positioned out of said second seat means inside said cavity, before injecting said plastics.

7. The method according to claim 6, wherein said clamping step comprises maintaining said assembly distanced from first walls of said first half-mould and from second walls of said second half-mould.

8. The method according to claim 6, wherein said step of disengaging said support means comprises disengaging firstly said second support means from said assembly, maintaining said first support means in said through hole, when said injected plastics reach a zone of said cavity interposed between said second half-mould and said assembly such that said injection configuration is guaranteed.

9. The method according to claim 8, wherein said disengaging step firstly is achieved when said cavity is 90% filled of plastics.

10. The method according to claim 8, wherein said disengaging firstly is achieved when said cavity is 94% filled of plastics.

11. The method according to claim 8, wherein said disengaging step firstly comprises clearing said cavity from said second support means or from said first support means, and housing said whole second support means or said whole first support means in said second seat means or in said first seat means.

12. The method according to claim 8, wherein said method further comprises disengaging lastly said first support means from said through hole, after said second support means have been already disengaged, when said plastics injected in said cavity fill said cavity of an amount such that said injection configuration is guaranteed.

13. The Method according to claim 12, said method further comprising filling said through hole with said plastics before said plastics are completely cured.

14. The method according to claim 12, wherein said step of disengaging lastly said first support means is achieved when said cavity is 95% filled of plastics.

15. The method according to claim 12, wherein said step of disengaging lastly comprises clearing said cavity from said first support means, and housing said whole first support means in said first seat means.

16. The method according to claim 6, wherein said step of disengaging said support means comprises disengaging firstly said first support means from said assembly, said second support means still supporting said assembly, when said plastics injected in said cavity reach a zone of said cavity interposed between said first half-mould and said assembly such that said injection configuration is guaranteed.

17. The method according to claim 16, wherein said method further comprises disengaging lastly said second support means, after said first support means have been already disengaged, when said plastics injected in said cavity fill said cavity of an amount such that said injection configuration is guaranteed.

18. The method according to claim 17, wherein said step of disengaging lastly said second support means is achieved when said cavity is 99% filled of plastics.

19. The method according to claim 1, wherein said method further comprises filling a volume of said cavity between said first half-mould and said assembly and a volume of said cavity between said second half-mould and said assembly with respective amounts of plastics which are approximately the same in the same time.

20. The method according to claim 1, wherein said injecting step comprises arranging a midpoint of the height of said injection sprue volume, along a symmetry axis of said injection sprue volume, substantially at a midpoint of the height of said further mounting through hole, along a symmetry axis of said injection sprue volume, such as to guarantee filling said cavity at the centre of said further mounting through hole.

21. An object comprising:
an RFID tag electronic assembly encapsulated in an external housing of plastics, wherein said external housing is made of plastics integrally moulded and devoid of discontinuity points, said assembly comprising at least a through hole, said through hole being filled with plastics and wherein said object comprises a mounting through hole suitable for housing mounting fixing means, said assembly being provided with a further mounting through hole in correspondence to said mounting through hole, said external housing encapsulating said further mounting through hole with a region of plastics integrally moulded devoid of discontinuity points, wherein said plastics is a thermally resistant plastics having a survival temperature in the range approximately of 220° C. to 300° C.

22. The object according to claim 21, wherein said thermally resistant plastics is a Teflon® or a Noryl® based compound or a Ryton® PPS based compound.

23. An apparatus for injection moulding plastics to provide an external housing of an object with a mounting through hole comprising an RFID tag electronic assembly being provided with a further mounting through hole, said apparatus comprising:
a first half-mould cooperating with a second half-mould to define a mould having an injection cavity, said apparatus further comprising support means associated to said mould movable between an extended position, in which said support means is positioned inside said cavity out of seat means of said mould and holds said assembly during injection of plastics, and a retracted position, in which said support means is housed in said seat means and is disengaged from said assembly, such that said plastics encapsulate said assembly providing an external housing of integrally moulded plastics devoid of discontinuity points,
wherein said apparatus comprises an injection nozzle on a protrusion of a half-mould facing a further protrusion provided on the other half-mould and defining an injection sprue volume therebetween in a closed position of said mould; said injection sprue volume being suitable for being positioned inside said further mounting through hole such as to inject said plastics from said injection sprue volume at the same time towards said first half-mould and said second half-mould, encapsulating said further mounting through hole with plastics and creating said mounting through hole in said external housing during injection.

24. The apparatus according to claim 23, wherein said support means comprises first support means associated to said first half-mould and second support means associated to said second half-mould; said first support means being movable between a first extended position, in which said first support means is positioned inside said cavity out of first seat means of said first half-mould and a first retracted position, in which said first support means is housed in said first seat means disengaged from said assembly; said second support means being movable between a second extended position in which said second support means is positioned inside said cavity out of second seat means of said second half-mould and a second retracted position in which said second support means is housed in said second seat means disengaged from said assembly.

25. The apparatus according to claim 24, wherein said first support means in said first extended position and said second support means in said second extended position are suitable for clamping, during injection of plastics, said assembly, maintaining said assembly in an injection configuration, distanced from first walls and second walls of respective first half-mould and second half-mould.

26. The apparatus according to claim 25, wherein said first support means comprises a first pin and said second half-mould comprises a second pin defining a pair of pins, said first pin being aligned and facing said second pin for clamping said assembly therebetween in said injection configuration.

27. The apparatus according to claim 26, wherein said first pin and/or said second pin have a tapered end, a portion of said first pin comprising said tapered end being suitable to be fit in a correspondent through hole of said assembly by an interference fit.

28. The apparatus according to claim 27, wherein said first pin and said second pin have a width greater than or equal to the width of said corresponding through hole.

29. The apparatus according to claim 25, wherein said first support means comprises a plurality of first pins and said second support means comprises a plurality of second pins defining a plurality of pair of pins, each first pin of said first plurality being aligned and facing a corresponding second pin of said second plurality for clamping said assembly therebetween in said injection configuration.

30. The apparatus according to claim 24, further comprising first driving means of said first support means and second driving means of said second support means to drive said first support means and said second support means independently one another.

31. The apparatus according to claim 23, wherein said first support means and second support means in said first retracted position and second retracted position are wholly housed in said first seat means and said second seat means thereby clearing said injection cavity from said support means.

32. The apparatus according to claim 23, wherein said injection sprue volume is externally delimited by an open lateral border, said injection sprue volume being positioned centered in the middle of said further mounting through hole so that said plastics is injected from said lateral border towards said first half-mould and second half-mould with amounts which are approximately the same in the same time.

33. The apparatus according to claim 23, wherein a midpoint of the height of said injection sprue volume, along a symmetry axis of said injection sprue volume, is arranged substantially at a midpoint of the height of said further mounting through hole along a symmetry axis of said further mounting through hole.

34. The apparatus according to claim 33, wherein said injection sprue volume and said further mounting through hole have the same symmetry axis.

* * * * *